United States Patent
Ding et al.

(10) Patent No.: US 8,803,216 B2
(45) Date of Patent: Aug. 12, 2014

(54) MEMORY CELL SYSTEM USING SILICON-RICH NITRIDE

(75) Inventors: Meng Ding, Sunnyvale, CA (US); Lei Xue, Sunnyvale, CA (US); Mark Randolph, San Jose, CA (US); Chi Chang, Redwood City, CA (US); Robert Bertram Ogle, Jr., San Jose, CA (US)

(73) Assignees: Spansion, LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 1164 days.

(21) Appl. No.: 11/277,008

(22) Filed: Mar. 20, 2006

(65) Prior Publication Data

US 2007/0215932 A1  Sep. 20, 2007

(51) Int. Cl.
  *H01L 29/788* (2006.01)
  *H01L 27/115* (2006.01)
  *H01L 21/28* (2006.01)
  *H01L 29/792* (2006.01)
  *H01L 29/51* (2006.01)

(52) U.S. Cl.
  CPC ........ *H01L 21/28282* (2013.01); *H01L 27/115* (2013.01); *H01L 27/11568* (2013.01); *H01L 29/7923* (2013.01); *H01L 29/513* (2013.01)
  USPC 257/315; 257/324; 257/E21.21; 257/E21.679; 257/E29.309

(58) Field of Classification Search
  USPC ............ 257/315, 324, E29.309, E21.21, 257/E21.679
  See application file for complete search history.

(56) References Cited

U.S. PATENT DOCUMENTS

| | | | | |
|---|---|---|---|---|
| 4,870,470 A | * | 9/1989 | Bass et al. | 257/324 |
| 5,578,848 A | * | 11/1996 | Kwong et al. | 257/296 |
| 5,594,691 A | | 1/1997 | Bashir | |
| 5,739,569 A | * | 4/1998 | Chen | 257/321 |
| 6,245,617 B1 | * | 6/2001 | Yang et al. | 438/287 |
| 6,248,628 B1 | * | 6/2001 | Halliyal et al. | 438/257 |
| 6,406,960 B1 | * | 6/2002 | Hopper et al. | 438/261 |
| 6,538,292 B2 | * | 3/2003 | Chang et al. | 257/391 |
| 6,563,736 B2 | | 5/2003 | Hsu et al. | |
| 6,645,882 B1 | * | 11/2003 | Halliyal et al. | 438/785 |
| 6,653,191 B1 | * | 11/2003 | Yang et al. | 438/258 |
| 6,709,928 B1 | * | 3/2004 | Jenne et al. | 438/264 |
| 6,744,675 B1 | * | 6/2004 | Zheng et al. | 365/185.28 |
| 6,818,558 B1 | * | 11/2004 | Rathor et al. | 438/694 |
| 6,882,567 B1 | | 4/2005 | Wong | |
| 6,894,932 B1 | * | 5/2005 | Melik-Martirosian et al. | 365/185.28 |
| 6,898,117 B2 | | 5/2005 | So et al. | |
| 2003/0203572 A1 | * | 10/2003 | Yoshino | 438/257 |
| 2004/0070020 A1 | * | 4/2004 | Fujiwara et al. | 257/314 |
| 2004/0251521 A1 | * | 12/2004 | Tanaka et al. | 257/639 |
| 2005/0199944 A1 | * | 9/2005 | Chen et al. | 257/324 |
| 2005/0285184 A1 | * | 12/2005 | Jung | 257/324 |
| 2007/0082447 A1 | * | 4/2007 | Lu et al. | 438/264 |

\* cited by examiner

*Primary Examiner* — Peniel M Gumedzoe
(74) *Attorney, Agent, or Firm* — Farjami & Farjami LLP

(57) ABSTRACT

A memory cell system including providing a substrate, forming a charge-storing stack having silicon-rich nitride on the substrate, and forming a gate on the charge-storing stack.

20 Claims, 2 Drawing Sheets

MEMORY CELL SYSTEM USING SILICON-RICH NITRIDE

TECHNICAL FIELD

The present invention relates generally to memory cell systems, and more particularly to a system for memory cells using silicon-rich nitride.

BACKGROUND ART

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lacks erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

Conventionally, Flash memory is constructed of many Flash memory cells where a single bit is stored in each memory cell and the cells are programmed by electron injection and may be erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

Thus a need still remains for a memory system to provide increasing density without sacrificing speed and reliability. In view of the increasing demand for density of portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a memory cell system including providing a substrate, forming a charge-storing stack having silicon-rich nitride on the substrate, and forming a gate on the charge-storing stack.

Certain embodiments of the invention have other advantages in addition to or in place of those mentioned or obvious from the above. The advantages will become apparent to those skilled in the art from a reading of the following detailed description when taken with reference to the accompanying drawings.

BEST MODE FOR CARRYING OUT THE INVENTION

Figure 1:
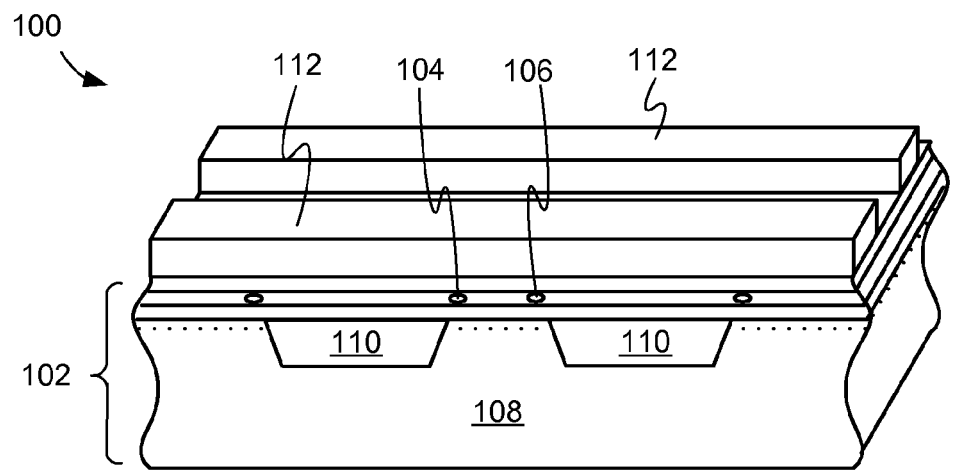
FIG. 1 is a cross-sectional isometric view of a memory cell system in an embodiment of the present invention.

In the following description, numerous specific details are given to provide a thorough understanding of the invention. However, it will be apparent that the invention may be practiced without these specific details. In order to avoid obscuring the present invention, some well-known circuits, package configurations, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs.

Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional isometric view of a memory cell system 100 in an embodiment of the present invention. The memory cell system 100 includes a memory cell stack 102 including a first location 104 and a second location 106. The first location 104 and the second location 106 provide regions for storing an electrical charge, such as electrons. For illustrative purposes, the memory cell system 100 is shown as a dual cell memory with two locations for storing electrical charges, although it is understood that any number of locations may be provided, as well.

The memory cell stack 102 also includes a semiconductor substrate 108 having bit lines 110, such as implanted n-type active area, providing access in pairs to the memory cell system 100 for decoding processes, such as reading, programming and erasing. The memory cell system 100 also includes word lines 112, such as polysilicon, acting as control gates in cooperation with pairs of the bit lines 110 for the decoding processes, such as reading, programming and erasing. Depending upon a signal on the word lines 112 and the connection of the bit lines 110 to an electrical source or drain, the memory cell system 100 may read, program or erase the first location 104 or the second location 106.

The bit lines 110 extend in parallel with one another and the word lines 112 extend in parallel to one another and at right angles to the bit lines 110. The bit lines 110 and the word lines 112 may have electrical contacts (not shown) and electrical interconnections (not shown) to programming circuitry (not shown) such as x-decoders and y-decoders. The programming circuitry provides control of the decoding processes, such as reading, programming and erasing.

Figure 2:
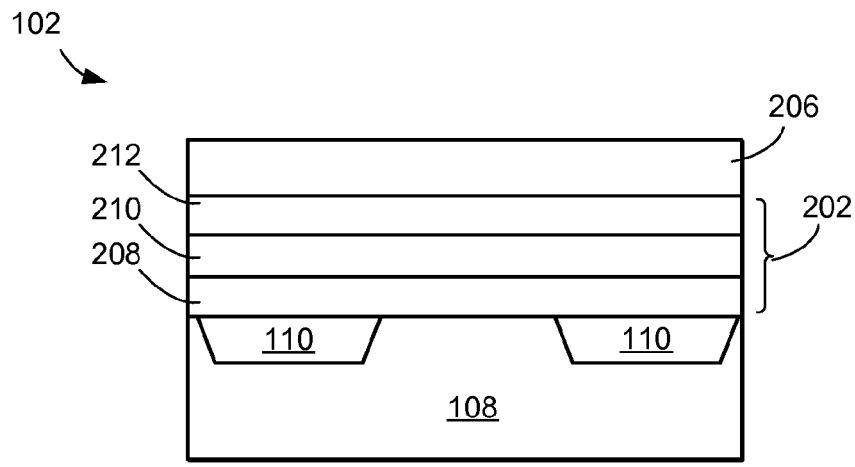
FIG. 2 is a cross-sectional view of the memory cell stack as shown in FIG. 1.

Referring now to FIG. 2, therein is shown a cross-sectional view of the memory cell stack 102 as shown in FIG. 1. The memory cell stack 102 includes a charge-storing stack 202 formed on the semiconductor substrate 108. A semiconductor gate 206 is formed on the charge-storing stack 202.

The charge-storing stack 202 provides locations between the bit lines 110 for storage of electrical charges. The semiconductor substrate 108 and the semiconductor gate 206 provide access for reading and erasing storage locations of the electrical charges. The semiconductor substrate 108 may include the bit lines 110. In this embodiment, the semiconductor substrate 108 is a p-doped layer and the semiconductor gate 206 is an n-doped layer.

The charge-storing stack 202 is constructed of multiple layers. A first insulating layer 208 of the charge-storing stack 202 is formed over the semiconductor substrate 108. A charge-storing layer 210 of the charge-storing stack 202 is formed on the first insulating layer 208. The charge-storing layer 210 provides locations for storage of the electrical charges. A second insulating layer 212 of the charge-storing stack 202 is formed on the charge-storing layer 210.

The first insulating layer 208 and the second insulating layer 212 are formed of a dielectric oxide, such as silicon dioxide ($SiO_2$). The first insulating layer 208 may be a thin layer, such as approximately 20 to 30 angstroms or a thick layer, such as greater than approximately 45 angstroms.

The charge-storing layer 210 is formed of a silicon-rich nitride (SRN or SiRN) semiconductor, such as silicon nitride ($Si_xN_y$). It has been discovered that the silicon-rich nitride improves the erase function, such as Fowler-Nordheim tunneling, for erasing the locations with the electrical charges by an unexpected approximately three or more orders of magnitude over nitride alone. The improvement in the erase function may be larger with the thick layer of the first insulating layer 208 than with the thin layer of the first insulating layer 208. The charge-storing stack 202 is often referred to as an O—N—O layer due to the oxide, nitride, and oxide construction.

The silicon-rich nitride may be formed by a chemical vapor deposition process, CVD, wherein two types of gases, such as NH3 and SiH4, interact during the deposition of the silicon-rich nitride. A ratio of the gases, such as $NH_3:SiH_4$, is below approximately 360:60, but higher than approximately 53:330, to be considered silicon-rich nitride for storing two or more bits. The silicon-rich nitride may be include a higher ratio, such as 28:360, to provide conductivity for a single bit storage.

The charge-storing stack 202 provides a storage medium for storing electrons (not shown). The charge-storing layer 210 may provide two or more charge-storing locations for storing the electrons in a single instance of the memory cell stack 102. The first insulating layer 208 and the second insulating layer 212 provide containment of the electrons. The electrons provide a substantial change in the threshold voltage for the memory cell system 100 allowing for detection of the stored electrons.

The memory cell system 100 does not interfere with other adjacent instances of the memory cell system 100 because each instance of the memory cell system 100 is programmed one at a time and only one instance of the memory cell system 100 is active during programming.

The memory cell system 100 is designed to provide designated operations, such as programming, reading and erasing as well as deriving necessary voltages to effect such operations. To effect the designated operations, predetermined voltages are connected to the memory cell system 100 through a source (not shown), a drain (not shown) and the semiconductor gate 206.

Figure 3:
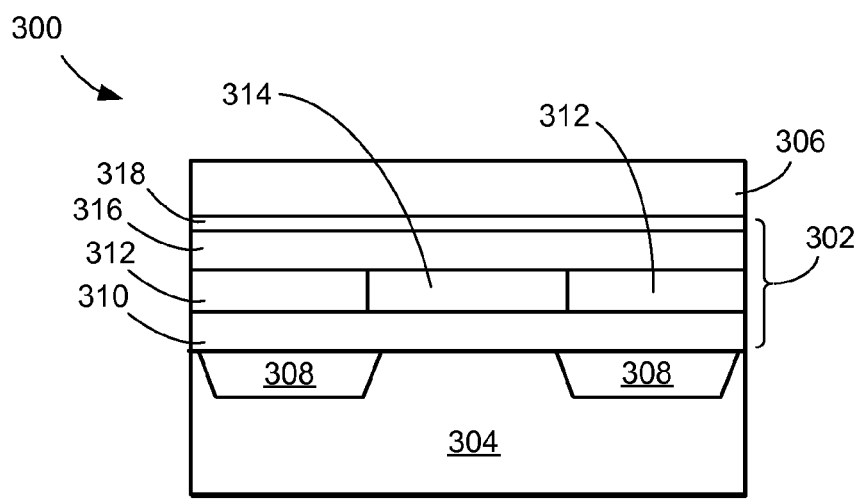
FIG. 3 is a cross-sectional view of a memory cell stack in an alternative embodiment of the present invention.

Referring now to FIG. 3, therein is shown a cross-sectional view of a memory cell stack 300 in an alternative embodiment of the present invention. Similar to the memory cell stack 102 of FIG. 1, the memory cell stack 300 includes a channel-bit charge-storing stack 302 formed on a semiconductor substrate 304. A semiconductor gate 306 is formed on the channel-bit charge-storing stack 302. The channel-bit charge-storing stack 302 provides locations between bit lines 308 for storage of electrical charges. The semiconductor substrate 304 and the semiconductor gate 306 provide access for reading and erasing storage locations of the electrical charges. The semiconductor substrate 304 may include the bit lines 308. In this embodiment, the semiconductor substrate 304 is a p-doped layer and the semiconductor gate 306 is an n-doped layer.

In a manner similar to the charge-storing stack 202 of FIG. 2, the channel-bit charge-storing stack 302 is constructed of multiple layers. A first insulating layer 310 of the channel-bit charge-storing stack 302 is formed over the semiconductor substrate 304. Bit-storing regions 312 of the channel-bit charge-storing stack 302 are formed on the first insulating layer 310. The bit-storing regions 312 provide locations for storage of the electrical charges.

A channel region 314 of the channel-bit charge-storing stack 302 is also formed on the first insulating layer 310 between the bit-storing regions 312. A second insulating layer 316 of the channel-bit charge-storing stack 302 is formed on the bit-storing regions 312 and the channel region 314. A blocking layer 318 is formed over the second insulating layer 316 to prevent the semiconductor gate 306 from injecting electrons to the channel region 314 during erasing, such as Fowler-Nordheim tunneling erase.

The first insulating layer 310 and the second insulating layer 316 are formed of a dielectric oxide, such as silicon dioxide ($SiO_2$). The first insulating layer 310 may be a thin layer, such as approximately 20 to 30 angstroms or a thick layer, such as greater than approximately 45 angstroms. The bit-storing regions 312 are formed of a silicon-rich nitride (SRN or SiRN) semiconductor, such as silicon nitride ($Si_xN_y$).

It has been discovered that the silicon-rich nitride improves the erase function, such as Fowler-Nordheim tunneling, for erasing the locations with the electrical charges by an unexpected approximately three or more orders of magnitude over nitride alone. The improvement in the erase function may be larger with the thick layer of the first insulating layer 310 than with the thin layer of the first insulating layer 310.

The channel region 314 is formed of a nitride layer, such as silicon nitride (SiN). The blocking layer 318 is formed of a hi-K layer, such as hi-K alumina ($Al_2O_3$).

The memory cell stack 300 is activated in a manner substantially the same as the memory cell system 100 of FIG. 1.

Figure 4:
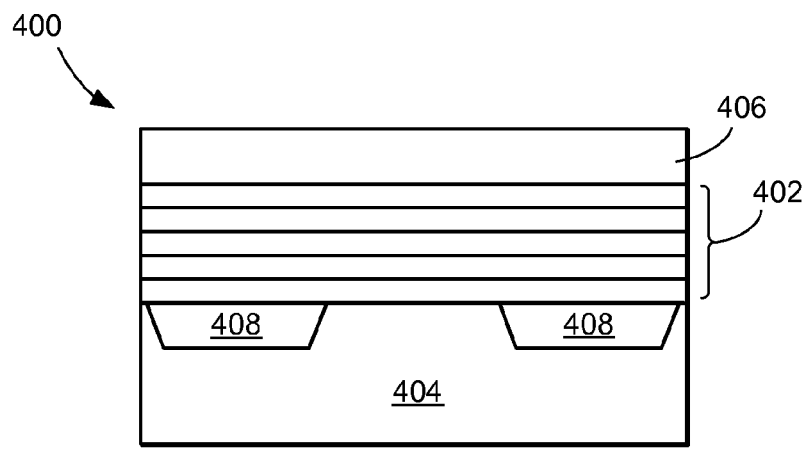
FIG. 4 is a cross-sectional view of a memory cell stack in another alternative embodiment of the present invention.

Referring now to FIG. 4, therein is shown a cross-sectional view of a memory cell stack 400 in another alternative embodiment of the present invention. Similar to the memory cell system 100 of FIG. 1 and the memory cell stack 300 of FIG. 3, the memory cell stack 400 includes a multi-layered charge-storing stack 402 formed on a semiconductor substrate 404. A semiconductor gate 406 is formed on the multi-layered charge-storing stack 402. The multi-layered charge-storing stack 402 provides locations between bit lines 408 for storage of electrical charges. The semiconductor substrate 404 and the semiconductor gate 406 provide access for reading and erasing storage locations of the electrical charges. The semiconductor substrate 404 may include the bit lines 408. In this embodiment, the semiconductor substrate 404 is a p-doped layer and the semiconductor gate 406 is an n-doped layer.

The memory cell stack 400 is activated in a manner substantially the same as the memory cell stack 102 of FIG. 1 and the memory cell stack 300 of FIG. 3.

Figure 5:
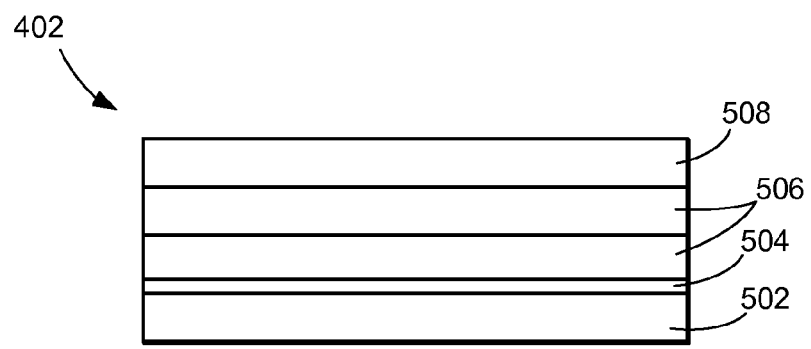
FIG. 5 is a cross-sectional view of the multi-layered charge-storing stack as shown in FIG. 3.

Referring now to FIG. 5, therein is shown a cross-sectional view of the multi-layered charge-storing stack 402 as shown in FIG. 4. In a manner similar to the charge-storing stack 202 of FIG. 2 and the channel-bit charge-storing stack 302 of FIG. 3, the multi-layered charge-storing stack 402 is constructed of multiple layers. A first insulating layer 502 of the multi-layered charge-storing stack 402 is formed over the semiconductor substrate 304 of FIG. 3. A tunneling layer 504 is formed on the first insulating layer 502 to prevent charges from leaking through the first insulating layer 502 when the first insulating layer 502 is very thin. Charge-storing layers 506 of the multi-layered charge-storing stack 402 are formed on the tunneling layer 504. The charge-storing layers 506 having varied silicon content provide locations between the bit lines 408 of FIG. 4 for storage of the electrical charges. A second insulating layer 508 of the multi-layered charge-storing stack 402 is formed on the charge-storing layers 506.

The first insulating layer 502 and the second insulating layer 508 are formed of a dielectric oxide, such as silicon dioxide ($SiO_2$). The first insulating layer 502 may be a thin layer, such as approximately 20 to 30 angstroms or a thick layer, such as greater than approximately 45 angstroms. The tunneling layer 504 is formed of a nitride layer, such as silicon nitride (SiN). The tunneling layer 504, with approximately 15 angstroms of silicon nitride, provides an approximately zero energy barrier to the charge-storing layers 506 under a negative gate stress of approximately −20V with a total stack thickness of about 130 angstroms.

The charge-storing layers 506 are formed of multi-layers of silicon-rich nitride, each of which can be of different silicon richness. The silicon-rich nitride improves the erase function, such as Fowler-Nordheim tunneling, for erasing the locations with the electrical charges by approximately three or more orders of magnitude over nitride. The improvement in the erase function may be larger with the thick layer of the first insulating layer 502 than with the thin layer of the first insulating layer 502.

Figure 6:
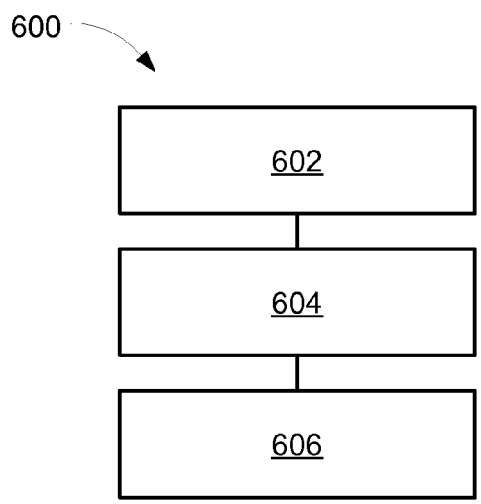
FIG. 6 is a flow chart of a system for a memory cell in an embodiment of the present invention.

Referring now to FIG. 6, therein is shown a flow chart of a system 600 for a memory cell in an embodiment of the present invention. The system 600 includes providing substrate in a block 602; forming a charge-storing stack having silicon-rich nitride on the substrate in a block 604; and forming a gate on the charge-storing stack in a block 606.

In greater detail, a method to fabricate the memory cell system 100, in an embodiment of the present invention, is performed as follows:
1. The semiconductor substrate 108 is provided. (FIG. 1)
2. The first insulating layer 208 is formed on the semiconductor substrate 108. (FIG. 2)
3. The charge-storing layer 210 having silicon-rich nitride is formed on the first insulating layer 108. (FIG. 2)
4. The second insulating layer 212 is formed on the charge-storing layer 210. (FIG. 2)
5. The semiconductor gate 206 is formed on the second insulting layer 212. (FIG. 2)

It has been discovered that the present invention thus has numerous advantages.

An advantage is that the present invention improves erase performance for the memory cell system. The silicon-rich nitride improves the erase function, such as Fowler-Nordheim tunneling, by approximately three or more orders of magnitude.

It has been discovered that the disclosed structure provides multiple bit storage in a single memory cell. The silicon-richness and channel region prevent the charges stored in distinct bit-storing regions from moving together.

It has also been discovered that the disclosed structure improves the manufacturability of memory systems. The present invention is fully compatible with simpler process methods and equipment for manufacturing and product implementation.

Yet another discovery of the disclosed structure is improved performance for non-volatile memory systems. The present invention provides higher density, larger voltage margins and faster access than MLS architectures.

These and other valuable aspects of the present invention consequently further the state of the technology to at least the next level.

Thus, it has been discovered that the memory system method and apparatus of the present invention furnish important and heretofore unknown and unavailable solutions, capabilities, and functional advantages for memory systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of producing a memory cell system, said method comprising:
   providing a substrate;
   forming a charge-storing stack on said substrate, wherein said forming said charge-storing stack comprises:
   forming a first insulating layer,
   forming a tunneling layer directly on said first insulating layer,
   forming a first silicon-rich nitride charge-storing layer over said tunneling layer, forming at least a second silicon-rich nitride charge-storing layer directly on said first silicon-rich nitride charge storing layer, and forming a second insulating layer directly over said at least second silicon-rich nitride charge-storing layer; and forming a gate on said charge-storing stack.

2. The method of claim 1, wherein said forming said charge-storing stack further comprises forming two or more charge-storing locations.

3. The method of claim 1, wherein each of said first and said at least second silicon-rich nitride charge-storing layers has a different silicon richness.

4. The method of claim 1 further comprising forming a source and a drain in said substrate.

5. A memory cell system comprising:
a substrate;
a charge-storing stack on said substrate, wherein said charge-storing stack comprises:
a first insulating layer,
a tunneling layer directly on said first insulating layer,
a first silicon-rich nitride charge-storing layer over said tunneling layer,
at least a second silicon-rich, nitride charge-storing layer directly on said first silicon-rich nitride charge-storing layer, and
a second insulating layer formed directly over said at least second silicon-rich nitride charge-storing layer; and
a gate on said charge-storing stack.

6. The system of claim 5, wherein said charge-storing stack further comprises two or more charge-storing locations.

7. The system of claim 5, wherein each of said first and said at least second silicon-rich nitride charge-storing layers has a different silicon richness.

8. The system of claim 5, wherein said substrate further comprises a source and a drain.

9. A method of producing a memory cell system, said method comprising:
providing a substrate having at least one bitline;
forming a first insulating layer on said substrate;
forming a plurality of silicon-rich nitride charge-storing regions over said first insulating layer, wherein at least one of said plurality of silicon-rich nitride charge-storing regions is above and generally aligned with said at least one bitline, and each of said plurality of silicon-rich nitride charge-storing regions are laterally spaced apart from one another by a respective silicon nitride insulating region formed on said first insulating layer;
forming a second insulating layer on said plurality of silicon-rich nitride charge-storing layer and said respective silicon nitride insulating region; and
forming a gate on said second insulating layer.

10. The method of claim 9 further comprising forming a blocking layer between said second insulating layer and said gate.

11. The method of claim 10, wherein said blocking layer comprises a high-K dielectric.

12. The method of claim 10, wherein said blocking layer comprises a high-K alumina ($Al_2O_3$).

13. The method of claim 9, wherein said forming said plurality of silicon-rich nitride charge-storing regions further comprises forming two or more charge-storing locations for each of said at least one bitline.

14. The method of claim 9 further comprising forming a source and a drain in said substrate.

15. A memory cell system comprising:
a substrate having at least one bitline;
a first insulating layer on said substrate;
a plurality of silicon-rich nitride charge-storing regions over said first insulating layer, wherein at least one of said plurality of silicon-rich nitride charge-storing regions is above and generally aligned with said at least one bitline, and each of said plurality of silicon-rich nitride charge-storing regions are laterally spaced apart from one another by a respective silicon nitride insulating region formed on said first insulating layer;
a second insulating layer on said plurality of silicon-rich nitride charge-storing regions and said respective silicon nitride insulating region; and
a gate on said second insulating layer.

16. The system of claim 15 further comprising a blocking layer between said second insulating layer and said gate.

17. The system of claim 16, wherein said blocking layer comprises a high-K dielectric.

18. The system of claim 16, wherein said blocking layer comprises a high-K alumina ($Al_2O_3$).

19. The system of claim 15, wherein said plurality of silicon-rich nitride charge-storing regions further comprises two or more charge-storing locations for each of said at least one bitline.

20. The system of claim 15, wherein said substrate further comprises a source and a drain.

\* \* \* \* \*